United States Patent
Nakamura

(10) Patent No.: US 9,974,182 B2
(45) Date of Patent: May 15, 2018

(54) CIRCUIT ASSEMBLY

(71) Applicants: AutoNetworks Technologies, Ltd., Yokkaichi, Mie (JP); Sumitomo Wiring Systems, Ltd, Yokkaichi, Mie (JP); Sumitomo Electric Industries, Ltd., Osaka-shi, Osaka (JP)

(72) Inventor: Arinobu Nakamura, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days. days.

(21) Appl. No.: 15/326,870

(22) PCT Filed: Jul. 1, 2015

(86) PCT No.: PCT/JP2015/069019
§ 371 (c)(1),
(2) Date: Jan. 17, 2017

(87) PCT Pub. No.: WO2016/013362
PCT Pub. Date: Jan. 28, 2016

(65) Prior Publication Data
US 2017/0202088 A1 Jul. 13, 2017

(30) Foreign Application Priority Data
Jul. 22, 2014 (JP) ................................ 2014-148721

(51) Int. Cl.
*H05K 7/10* (2006.01)
*H05K 1/18* (2006.01)
*H05K 1/11* (2006.01)

(52) U.S. Cl.
CPC ............ *H05K 1/181* (2013.01); *H05K 1/111* (2013.01); *H05K 1/115* (2013.01); *H05K 2201/10166* (2013.01); *H05K 2201/10522* (2013.01); *H05K 2201/10628* (2013.01); *H05K 2201/10757* (2013.01); *H05K 2201/10939* (2013.01)

(58) Field of Classification Search
USPC .................................................. 361/761, 748
See application file for complete search history.

(56) References Cited

FOREIGN PATENT DOCUMENTS

| JP | S64-013788 A | 1/1989 | |
|---|---|---|---|
| JP | H03-038653 U | 4/1991 | |
| JP | H06-085427 A | 3/1994 | |
| JP | H06-045393 U | 6/1994 | |
| JP | H07-336009 A | 12/1995 | |
| JP | 2003-164040 A * | 11/2001 | ............... H02G 3/16 |

(Continued)

*Primary Examiner* — Andargie M Aychillhum
(74) *Attorney, Agent, or Firm* — Dinsmore & Shohl LLP

(57) ABSTRACT

Provided is a circuit assembly that does not require e.g. bending of a terminal of an electronic component. A circuit assembly includes an electronic component that is to be mounted is connected to a conductive member through a first opening in a state in which its main body is disposed on one side of a substrate covering at least a part of the first opening formed in the substrate, and a first terminal is connected to a conductive pattern (a land) of the substrate, and a second terminal is connected to the conductive member through a second opening formed in the substrate.

13 Claims, 9 Drawing Sheets

(56) References Cited

FOREIGN PATENT DOCUMENTS

| JP | 2003164040 A | 6/2003 |
| JP | 2003318579 A | 11/2003 |
| JP | 2004349418 A | 12/2004 |
| JP | 2006005096 A | 1/2006 |

* cited by examiner

CIRCUIT ASSEMBLY

CROSS-REFERENCE TO RELATED APPLICATIONS

This application is the U.S. national stage of PCT/JP2015/069019 filed Jul. 1, 2015, which claims priority of Japanese Patent Application No. JP 2014-148721 filed Jul. 22, 2014.

FIELD OF THE INVENTION

The present invention relates to a circuit assembly including a substrate and a conductive member.

BACKGROUND

Circuit assemblies are known in which a conductive member that is part of a circuit that allows a relatively large electric current to flow is fixed to a substrate on which a conductive pattern is formed that is part of a circuit that allows a relatively small electric current to flow (for example, see JP 2003-164040A).

This type of circuit assembly sometimes includes an electronic component having a terminal connected to the conductive pattern formed on the substrate and a terminal connected to the conductive member. In the circuit assembly including such an electronic component, the height of the conductive pattern and the height of the conductive member are different from each other. Therefore, the difference in height needs to be absorbed by bending one of the terminals, for example (in JP 2003-164040A, as shown in FIG. 4 for example, the shapes of a terminal 34 and a terminal 36 are different from each other).

An issue resolved by the present invention is to provide a circuit assembly that does not require e.g. bending of a terminal of an electronic component as described above.

SUMMARY OF INVENTION

In order to resolve the above-described issue, a circuit assembly according to the present invention includes a substrate provided with a conductive pattern formed on one side of the substrate, an electronic component that has a main body, and a first terminal and a second terminal that protrude from the main body, and that is mounted on the one side of the substrate, and a conductive member constituting a conductive path fixed to another side of the substrate. The electronic component is connected to the conductive member through a first opening in a state in which the main body is disposed on the one side of the substrate covering at least a part of the first opening formed in the substrate, and the first terminal is connected to the conductive pattern of the substrate, and the second terminal is connected to the conductive member through a second opening formed in the substrate.

Front ends of the first terminal and the second terminal may be located at approximately the same height.

A bottom of the main body may be provided with a third terminal, and the third terminal may be connected to the conductive member through the first opening together with the main body.

A connection portion may be provided in a vicinity of a location on the one side of the substrate at which the first opening is formed, and at least a part of a region of the main body of the electronic component that is located on the one side of the substrate may be connected to the connection portion.

A through-hole may be formed in the region of the substrate in which the connection portion is formed, and the third terminal may be connected to the connection portion, and may also be connected to the conductive member through the through-hole.

The electronic component may be disposed on the one side of the substrate such that the main body does not cover a part of the first opening.

The circuit assembly according to the present invention does not require processing such as bending of a terminal since the circuit assembly has a structure in which the main body of the electronic component is disposed on the one side of the substrate covering at least the part of the first opening formed in the substrate, and the second terminal is connected to the conductive member through the second opening formed in the substrate.

The height of the front end of the first terminal of the electronic component may be approximately equal to the height of the front end of the second terminal.

A structure is also possible in which the third terminal provided at the bottom of the main body is connected to the conductive member through the first opening together with the main body.

If the size of the first opening is too large and the electronic component positionally shifts with respect to the first opening, there is a risk that a part of the main body will enter the first opening. On the other hand, if the size of the first opening is too small, there is a risk that reliability of physical connection of the electronic component (the main body) to a combination of the substrate and the conductive member will have a problem. Therefore, with a structure in which the connection portion is provided in the vicinity of the location of the substrate at which the first opening is formed and at least a part of the main body is connected to the connection portion, the reliability of the physical connection of the electronic component (the main body) to the combination of the substrate and the conductive member can be improved.

If the third terminal is connected to not only the connection portion but also the conductive member through the through-hole, the circuit assembly has a structure in which the third terminal is connected to the conductive member through not only the first opening but also the through-hole. Therefore, the reliability of electrical connection is also improved.

If the circuit assembly has a structure in which the main body of the electronic component is disposed on the one side of the substrate so as not to cover the part of the first opening, it is possible to check whether or not connection between the main body and the conductive member through the first opening is reliably established from the part of the first opening that is not covered by the main body (an exposed portion).

DETAILED DESCRIPTION OF THE PREFERRED EMBODIMENTS

Hereinafter, an embodiment of the present invention will be described in detail with reference to the drawings. Note that unless indicated otherwise, "surface direction" in the description below refers to a surface direction of a substrate 10 and a conductive member 20, and "height direction" (vertical direction) refers to a direction orthogonal to the surface direction (where a surface of the substrate 10 on which a conductive pattern is formed is the top surface).

Figure 1:
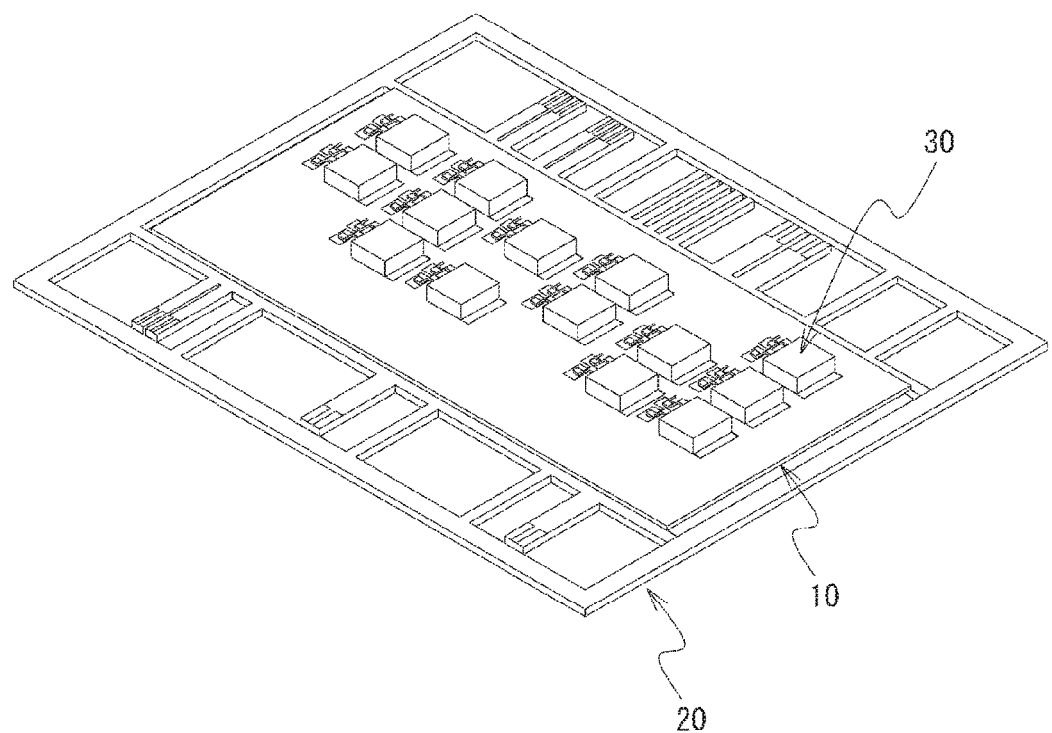
FIG. 1 is a diagram of an external appearance of a circuit assembly according to one embodiment of the present invention.
Figure 2:
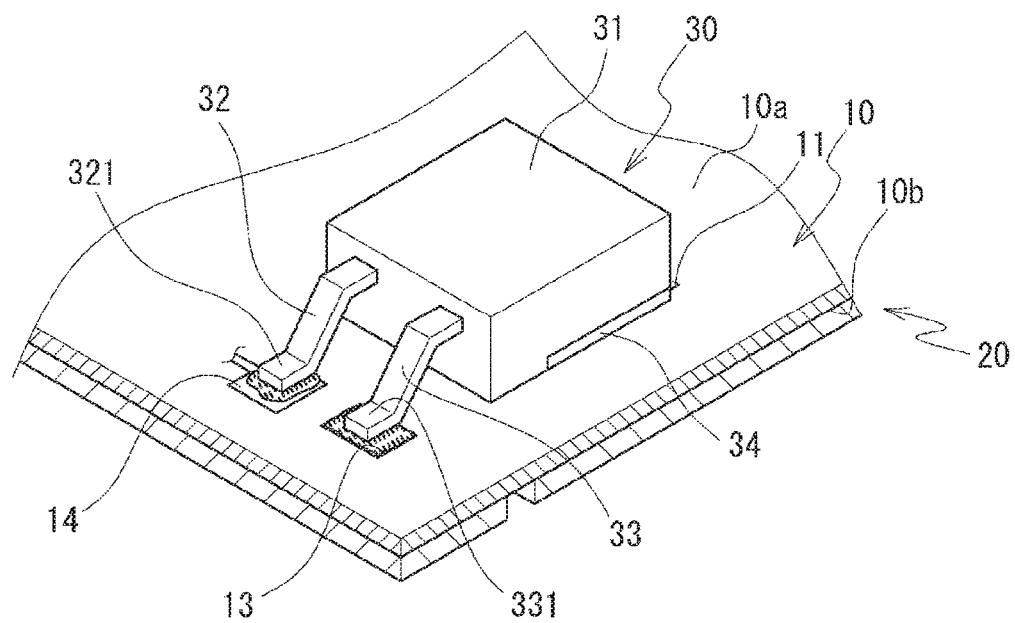
FIG. 2 is a diagram showing an enlarged region of the circuit assembly on which the electronic component is mounted.
Figure 3A:
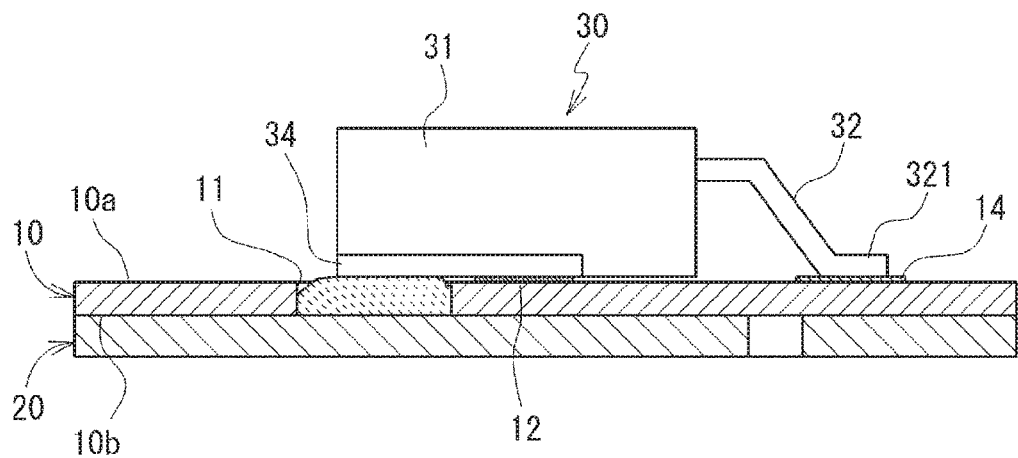
FIG. 3(*a*) is a cross-sectional view of a part (the substrate and the conductive member) of the region of the circuit assembly on which the electronic component is mounted viewed from the side of a first terminal.
FIG. 3(b) is a cross-sectional view of a part (the substrate and the conductive member) of the region of the circuit assembly on which the electronic component is mounted viewed from the side of a second terminal.
Figure 3B:
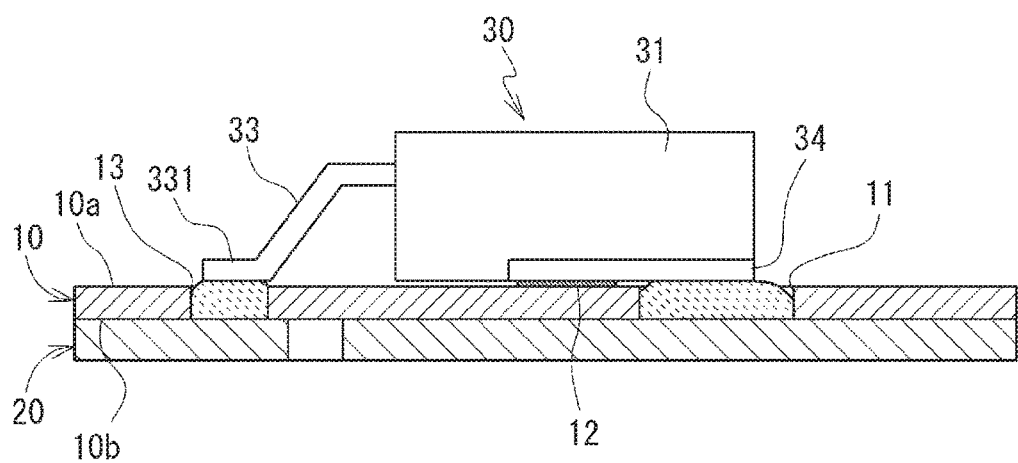

As shown in FIG. 1, a circuit assembly 1 according to one embodiment of the present invention includes the substrate 10, the conductive member 20, and electronic components 30. Hereinafter, their configurations will be specifically described with reference to FIGS. 1 to 4.

The substrate 10 is such that a conductive pattern (only a land 14, which is a portion of the conductive pattern and will be described later, is depicted) is formed on one side 10a (an upper surface side). A conductive path constituted by the conductive pattern is a conductive path (portion of the circuit) for control signals, through which an electric current flows that is smaller than the current through the conductive path (portion of the circuit) constituted by the conductive member 20.

The conductive member 20 is a plate-shaped portion fixed to another side 10b of the substrate 10. The conductive member 20 is formed into a predetermined shape by pressing or the like, and constitutes a conductive path for power, which is a portion through which a relatively large (larger than in the conductive path constituted by the conductive pattern) electric current flows. The conductive member 20 is also referred to as a "bus bar" (bus bar plate) or the like. The conductive member 20 is fixed to the other side 10b of the substrate 10 via an insulating adhesive sheet, for example, and the substrate 10 and the conductive member 20 are integrated into a single member (combination of the substrate 10 and the conductive member 20). Because the shape of the conductive path constituted by the conductive pattern or the conductive member 20 can be any shape, its description is omitted. Also, the overall shape of the substrate 10 and the conductive member 20 can be changed as appropriate. Note that the outer frame of the conductive member 20 shown in FIG. 1 will be cut off eventually.

The electronic components 30 are mounted on the substrate 10, and each has a main element body 31 and a terminal portion. The electronic components 30 of the present embodiment each have a first terminal 32, a second terminal 33, and a third terminal 34 serving as terminal portions. An example of such an electronic component 30 is a transistor (FET). In this case, the first terminal 32 is a gate terminal, the second terminal 33 is a source terminal, and the third terminal 34 is a drain terminal. As described later, the first terminal 32 is connected to the conductive pattern of the substrate 10, the second terminal 33 is connected to the conductive member 20, and the third terminal 34 is connected to a site other than the site of the conductive member 20 to which the second terminal 33 is connected. In the following explanations, it is assumed that the electronic component 30 has various types of terminals, but it may have a plurality of a given type of terminals.

The first terminal 32 and the second terminal 33 protrude from a side surface of the main body 31, which has an approximately rectangular parallelepiped shape. Specifically, the two terminals have base end portions protruding along the surface direction, portions that bend downward from the front ends of the base end portions, and front end portions 321 and 331 extending from the front ends of the bent portions along the surface direction. The heights of the front end portions 321 and 331 (positions in the vertical direction) that are soldered are approximately the same. In the present embodiment, the first terminal 32 and the second terminal 33 are formed to have the completely same shape. That is, when viewed in the direction along the surface of the main body 31 that is provided with the terminals, the first terminal 32 and the second terminal 33 overlap with each other.

The third terminal 34 is a plate-shaped portion provided at the bottom (a lower surface) of the main body 31. That is, the third terminal 34 extends in the surface direction. The third terminal 34 can also be regarded as a portion constituting at least a part of the bottom of the main body 31.

Such an electronic component 30 is mounted on the substrate 10 (combination of the substrate 10 and the conductive member 20) as follows. A first opening 11 that passes through the substrate 10 in its thickness direction is formed at a location of the substrate 10 on which the electronic component 30 is mounted. The first opening 11 has such a shape that the main body 31 of the electronic component 30 cannot go through the first opening 11. The electronic component 30 is placed on one side (a surface on which the conductive pattern is formed) of the substrate 10 such that its main body 31 covers at least a part of the first opening 11. At least a part of the third terminal 34 provided at the bottom of the main body 31 faces the first opening 11 (overlaps with the first opening 11 in the vertical direction). In the present embodiment, the main body 31 is placed on the one side 10a of the substrate 10 so as not to cover a part of the first opening 11.

The main body 31 of the electronic component 30 is soldered to the conductive member 20 through this first opening 11. Since the bottom of the main body 31 is provided with the third terminal 34, the third terminal 34 is electrically connected to a predetermined location (a part facing the first opening 11) of the conductive member 20. That is, by soldering the main body 31 (the third terminal 34) provided to cover at least a part of the first opening 11 to the conductive member 20 through the first opening 11, the main body 31 is physically connected to the conductive member 20 (the combination of the substrate 10 and the conductive member 20), and the third terminal 34 is electrically connected to the conductive member 20.

In this manner, the electronic component 30 being disposed on the one side 10a of the substrate 10 means that the bottom of the main body 31 includes a part facing the first opening 11 (a portion overlapping with the first opening 11 in the vertical direction), and a part that is in contact with the one side 10a of the substrate 10. In the present embodiment, the connection portion 12 is provided on a part of the one side 10a of the substrate 10 that is in contact with the bottom of the main body 31. That is, the connection portion 12 is provided in the vicinity of the first opening 11. The connection portion 12 can be made of the same material (for example, copper) as the conductive pattern. That is, the connection portion 12 can be produced in the same step as the step of forming the conductive pattern. Note that the connection portion 12 is not electrically connected to the conductive pattern.

The part of the main body 31 of the electronic component 30 that is in contact with the one side 10a of the substrate 10 is soldered to this connection portion 12. That is, the main body 31 of the electronic component 30 is connected to not only the conductive member 20 but also the substrate 10. Accordingly, the physical connection of the electronic component 30 to the combination of the substrate 10 and the conductive member 20 can be made much stronger.

Figure 4:
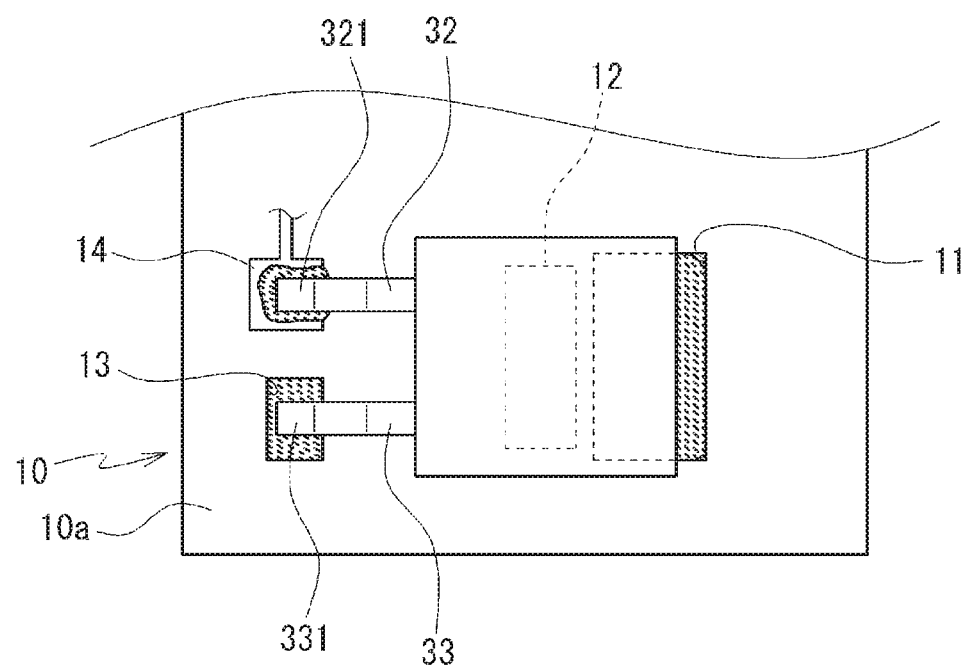
FIG. 4 is a plan view of the region of the circuit assembly on which the electronic component is mounted.
Figure 5:
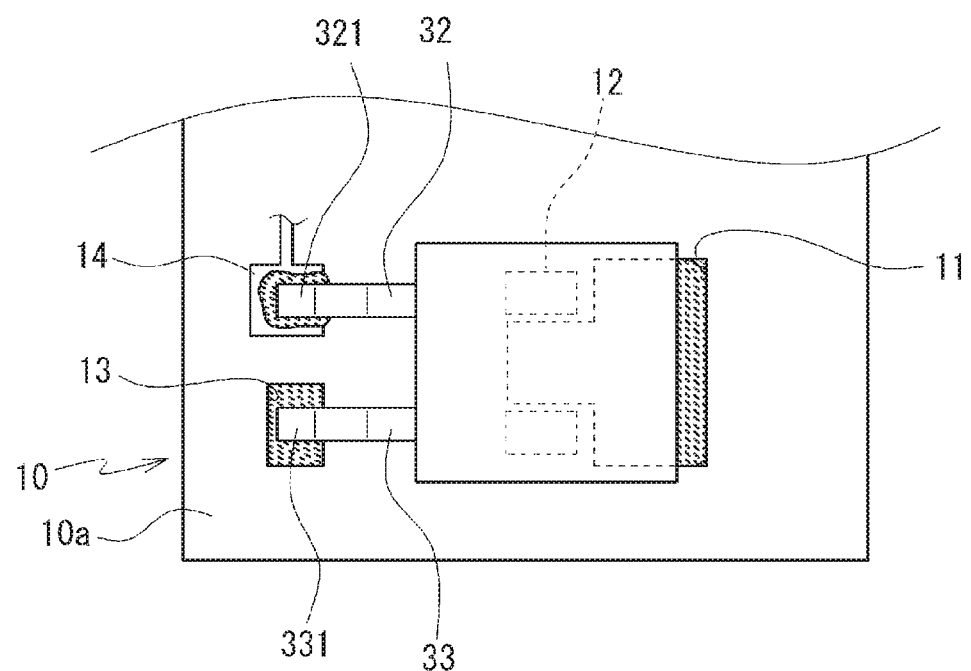
FIG. 5 is a plan view showing an example of the circuit assembly in which the connection portions are provided separately at a plurality of positions.

Note that the size and shape of the first opening 11 and the connection portion 12 can be changed as appropriate. A structure is possible in which as shown in FIG. 4, an approximately rectangular connection portion 12 is provided lined up next to the first opening 11, or a structure is possible in which as shown in FIG. 5, the connection portions 12 are provided separately at a plurality of locations. Because the first opening 11 is for connecting the main body 31 to the conductive member 20, and the connection portion 12 is for connecting the main body 31 to the substrate 10, the shape, position, size, and the like of the first opening 11 and the connection portion 12 need only be set in accordance with connection between the main body 31 and the conductive member 20, a strength required for connection between the main body 31 and the substrate 10, and the like.

In a state in which the electronic component 30 is placed at a predetermined position of the substrate 10, the front end portion 321 of the first terminal 32 of the electronic component 30 is located on a predetermined site of the conductive pattern. Specifically, the first terminal 32 is located on the land 14 (a portion of the conductive pattern) to which the first terminal 32 is connected. The first terminal 32 is soldered to this land 14. That is, the first terminal 32 is physically and electrically connected to the conductive pattern.

Also, a second opening 13 is formed in the substrate 10, passing through the substrate 10 in the thickness direction. The second opening 13 is formed at such a position that the front end portion 331 of the second terminal 33 overlaps with the second opening 13 in the vertical direction in a state in which the electronic component 30 is placed at a predetermined position of the substrate 10. Specifically, the front end portion 321 of the first terminal 32 and the front end portion 331 of the second terminal 33 have approximately the same height, and the front end portion 321 of the first terminal 32 being located on the one side 10a of the substrate 10 means that the front end portion 331 of the second terminal 33 is located on the second opening 13. In this manner, the second terminal 33 located on the second opening 13 is soldered to a predetermined site of the conductive member 20 through the second opening 13. That is, the second terminal 33 is physically and electrically connected to the conductive member 20. Note that it is naturally true that there is no direct electrical connection between a site of the conductive member 20 to which the second terminal 33 is connected and a site to which the third terminal 34 is connected (the second terminal 33 and the third terminal 34 are not short circuited). Also, although the first opening 11 and the second opening 13 are not connected to each other in the present embodiment, the two openings may be integrated into one. However, if solder in the first opening 11 and solder in the second opening 13 come into contact with each other, a short circuit occurs. Therefore, it is preferable that the two openings are separate from each other.

The method for mounting the electronic component 30 on the substrate 10 (the combination of the substrate 10 and the conductive member 20) is not limited to a specific method, and the electronic component 30 is preferably mounted by reflow soldering in order to make its manufacture easy, stabilize its quality, and the like. If a circuit assembly 1 is manufactured with reflow soldering, solder (a cream solder) is applied (printed) in advance to the inside of the first opening 11 and the second opening 13, onto the connection portion 12 and the land 14 in the combination of the substrate 10 and the conductive member 20, and then the solder is melted in a state in which the electronic component 30 is placed at a predetermined position. As a result, the circuit assembly 1 on which the electronic component 30 is mounted as described above can be obtained. If the electronic component 30 is mounted by such reflow soldering, it is preferable that the first opening 11 and the second opening 13 are separate from each other in order to prevent a short circuit of the second terminal 33 and the third terminal 34.

According to the circuit assembly 1 according to the present embodiment described above, the following functional effects can be achieved. The circuit assembly 1 according to the present embodiment has a structure in which the main body 31 of the electronic component 30 is disposed on the one side 10a of the substrate 10 covering at least a part of the first opening 11 formed in the substrate 10, and the second terminal 33 is connected to the conductive member 20 through the second opening 13 formed in the substrate 10, and thus no processing for bending a terminal or the like is required. That is, the height of the front end portion 321 of the first terminal 32 of the electronic component 30 and the height of the front end portion 331 of the second terminal 33 can be set approximately the same.

Also, the third terminal 34 provided at the bottom of the main body 31 can be connected to the conductive member 20 through the first opening 11 together with the main body 31. Accordingly, it is possible to achieve both physical connection between the electronic component 30 (the main body 31) and the conductive member 20 and electrical connection between the third terminal 34 and the conductive member 20. Also, heat generated in the main body 31 is efficiently released through the conductive member 20.

Also, if the size of the first opening 11 formed in the substrate 10 is too large and the electronic component 30 shifts with respect to the first opening 11, there is a risk that a part of the main body 31 will enter the first opening 11. For example, in the above-described reflow soldering step (in a state before the electronic component 30 is soldered), there is a risk that a part of the main body 31 will enter the first opening 11 due to vibration or the like. On the other hand, if the size of the first opening 11 is too small, the area of the portion that is in contact with the solder inside the first opening 11 of the main body 31 decreases. Thus, there is a risk that the reliability of physical connection of the electronic component 30 (the main body 31) to the combination of the substrate 10 and the conductive member 20 will be problematic. In contrast, in the present embodiment, the connection portion 12 is provided in the vicinity of the location of the substrate 10 at which the first opening 11 is formed, resulting in a structure in which at least a part of the main body 31 is connected to the connection portion 12. As a result, the reliability of physical connection of the electronic component 30 (the main body 31) to the combination of the substrate 10 and the conductive member 20 can be improved.

Also, because the main body 31 of the electronic component 30 is placed on the one side 10a of the substrate 10 so as not to cover a part of the first opening 11, it is possible to check whether or not the main body 31 is reliably connected to the conductive member 20 through the first opening 11 from the part of the first opening 11 that is not covered by the main body 31 (the exposed portion).

The following examples can be thought as variations of the circuit assembly 1 according to one embodiment of the present invention.

Figure 6A:
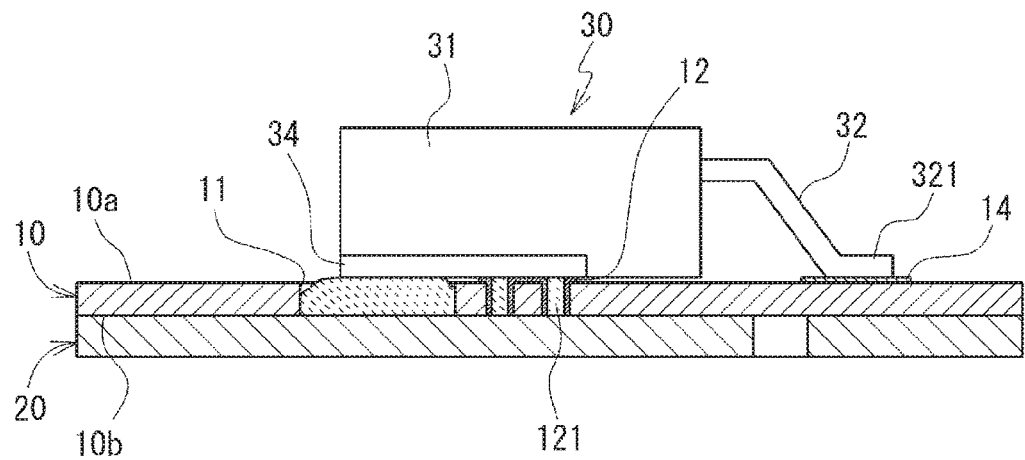
FIG. 6(a) is a cross-sectional view of a portion (the substrate and the conductive member) illustrating the circuit assembly according to a first variation viewed from the side of a first terminal.
Figure 6B:
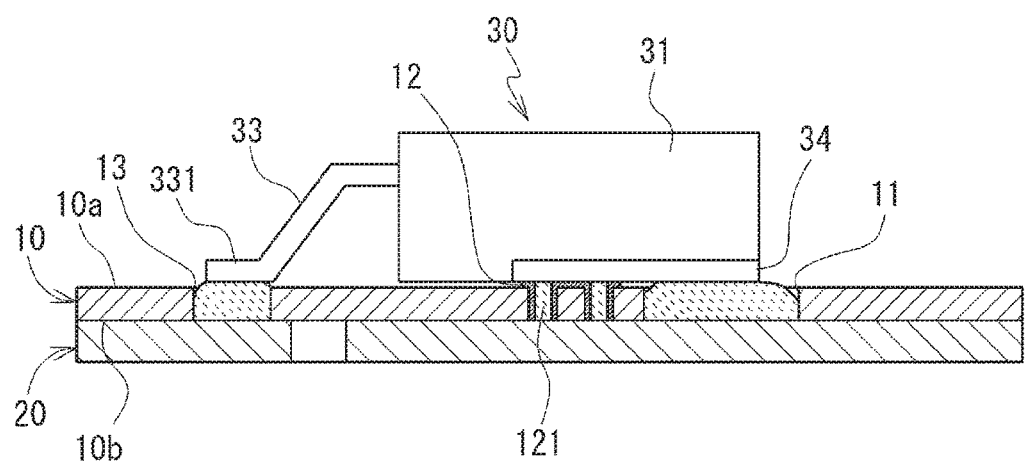
FIG. 6(b) is a cross-sectional view of a portion (the substrate and the conductive member) illustrating the circuit assembly according to a first variation viewed from the side of a second terminal.
Figure 7:
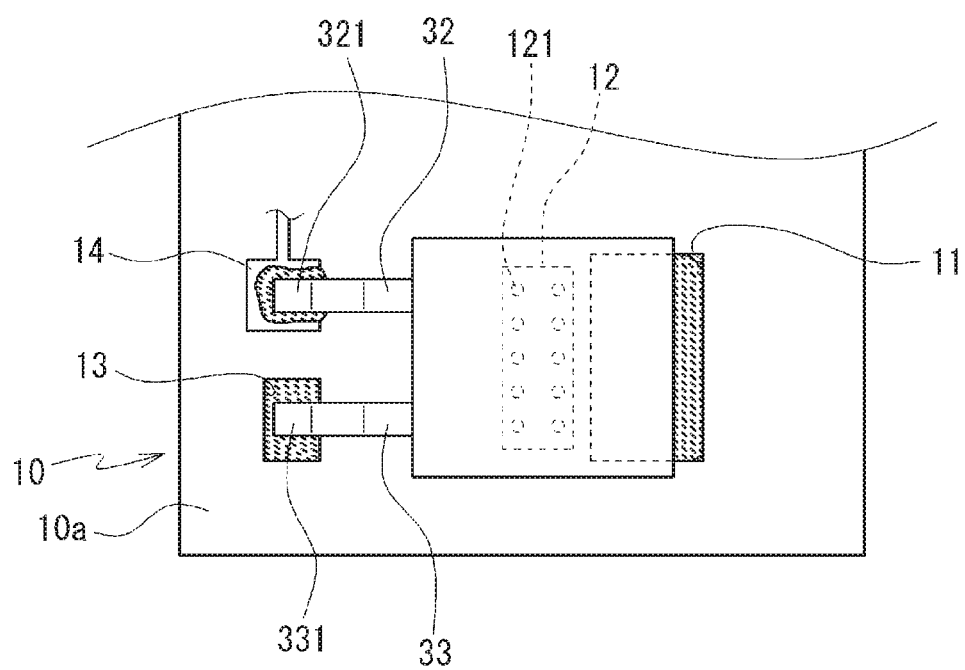
FIG. 7 is a plan view illustrating the circuit assembly according to the first variation.

In a first variation shown in FIGS. 6 and 7, through-holes 121 that pass through the substrate 10 in the thickness direction are formed at a portion of the substrate 10 at which the connection portion 12 is formed. It is preferable that a plurality of the through-holes 121 are formed. Also, it is preferable that a via is formed in each of the through-holes 121. In this example, the third terminal 34 provided at the bottom of the main body 31 is in contact with the connection portion 12 provided on the one side 10a of the substrate 10. Then, this third terminal 34 is soldered to the connection portion 12, and also soldered to the conductive member 20 through the through-holes 121. That is, the third terminal 34 is electrically connected to the conductive member 20 by the solder that has been applied to the inside of the through-holes 121. If the third terminal 34 is connected to not only the connection portion 12 but also the conductive member 20 through the through-holes 121 in this manner, the circuit assembly 1 has a structure in which the third terminal 34 is connected to the conductive member 20 through not only the first opening 11 but also the through-holes 121. As a result, the reliability of the electrical connection is also improved. That is, considering that the connection portion 12 to which the main body 31 is connected is provided, formation of the through-holes 121 at the portion at which the connection portion 12 is formed makes it possible to achieve strengthening of not only physical connection between the main body 31 and the substrate 10 but also electrical connection between the third terminal 34 and the conductive member 20 due to the connection portion 12.

Figure 8A:
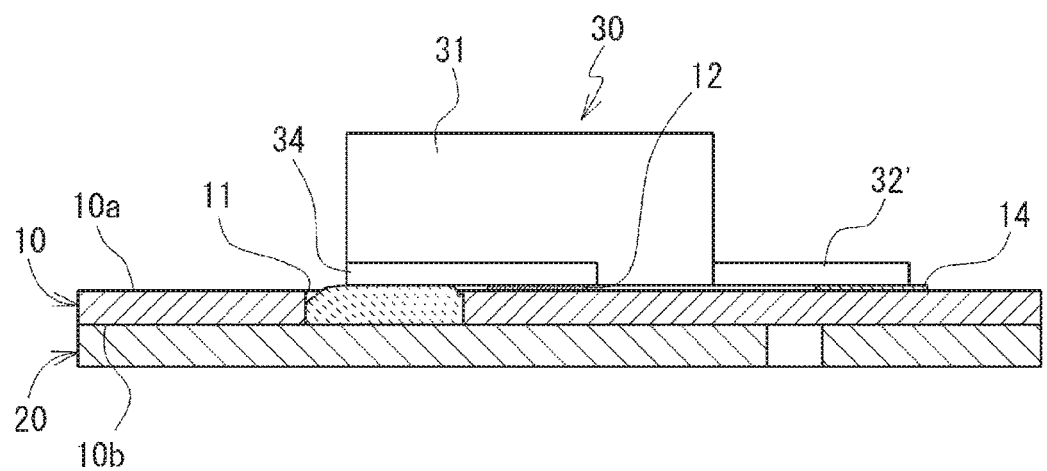
FIG. 8(a) is a cross-sectional view of a portion (the substrate and the conductive member) illustrating the circuit assembly according to a second variation taken from the side of a first terminal.
Figure 8B:
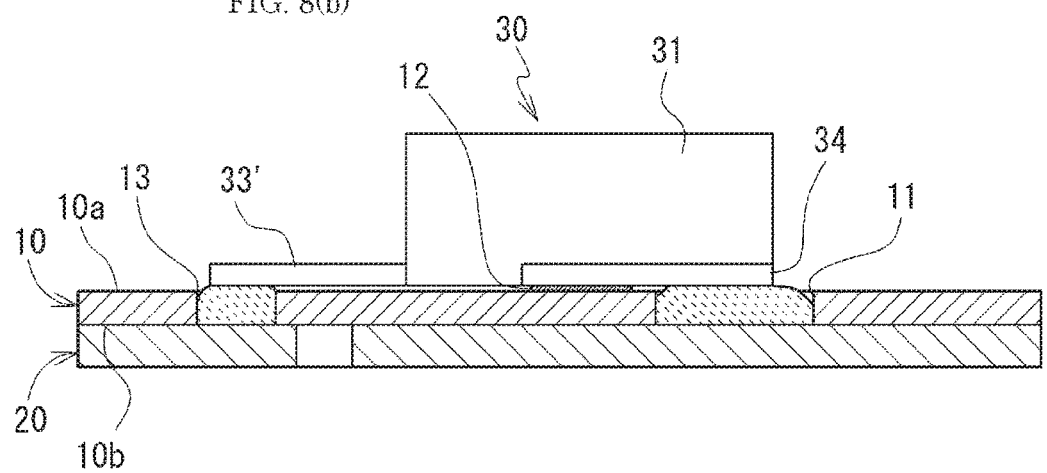
FIG. 8(b) is a cross-sectional view of a portion (the substrate and the conductive member) illustrating the circuit assembly according to a second variation taken from the side of a second terminal.

In a second variation shown in FIG. 8, the electronic component 30 having a shorter first terminal 32' and a shorter second terminal 33' is used. As described above, since the main body 31 of the electronic component 30 is disposed on the one side 10a of the substrate 10 covering at least a part of the first opening 11 formed in the substrate 10, the first terminal 32' need only have a length reaching to the land 14 of the conductive pattern, and the second terminal 33' need only have a length reaching to the second opening 13. As shown in the drawings, the terminals may have a shape extending linearly from the main body 31. As described above, the present invention is also excellent in that it is possible to use the electronic component 30 having shorter terminals that cannot be bent.

Figure 9:
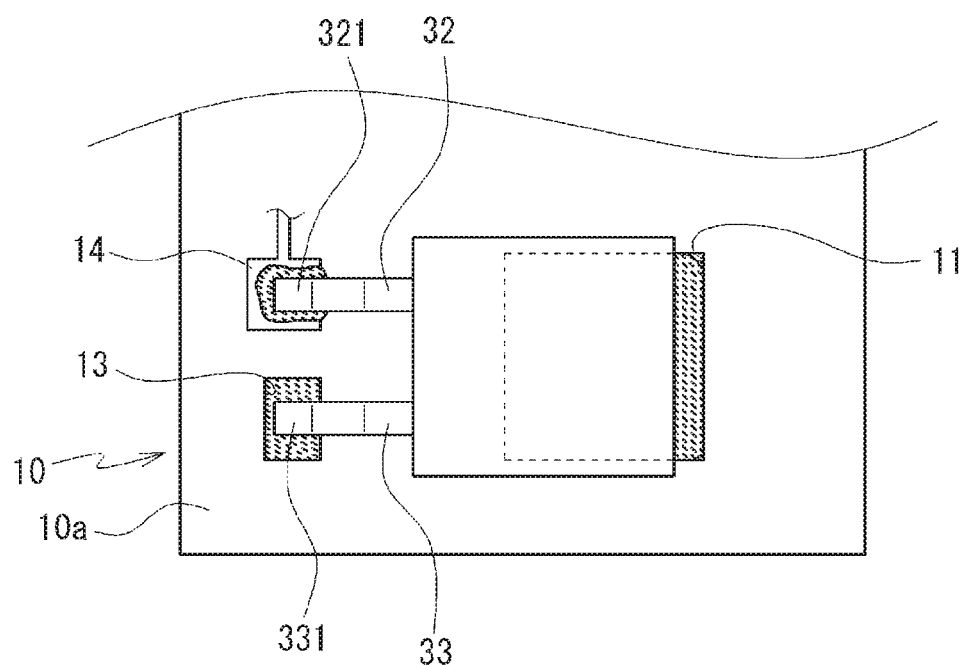
FIG. 9 is a plan view illustrating the circuit assembly according to a third variation.

A third variation shown in FIG. 9 has a configuration in which the connection portion 12 is not provided on the substrate 10. Because the main body 31 (the third terminal 34) is connected to the conductive member 20 through the first opening 11, connection between the main body 31 and the combination of the substrate 10 and the conductive member 20 can be achieved even if the connection portion 12 is not provided. If the connection portion 12 is provided, the size of the first opening 11 can be reduced, and thus there is an advantage in reducing the risk that a part of the main body 31 will enter the first opening 11.

Although the embodiment of the present invention has been described in detail above, the present invention is not merely limited to the above-described embodiment, and it will be appreciated that various modifications can be made without departing from the gist of the present invention.

For example, although the electronic component 30 in the above-described embodiment was described in which the terminal (the third terminal 34) is provided at the bottom of the main body 31, a similar mounting method to the above can also be applied to the electronic component 30 whose bottom is not provided with the terminal in this manner. That is, connection between the main body 31 and the conductive member 20 through the first opening 11 does not achieve electrical connection (only physical connection is achieved).

The invention claimed is:

1. A circuit assembly comprising:
a substrate provided with a conductive pattern formed on one side of the substrate;
an electronic component that has a main body, and a first terminal and a second terminal that protrude from the main body, and that is mounted on the one side of the substrate; and
a conductive member constituting a conductive path fixed to another side of the substrate,
a first opening formed on the substrate, the first opening being smaller than the electronic component, wherein the electronic component covers a portion of the first opening, and wherein the electronic component is spaced apart from the conductive member and connected to the conductive member through the first opening, and
the first terminal is connected to the conductive pattern of the substrate, and the second terminal is connected to the conductive member through a second opening formed in the substrate.

2. The circuit assembly according to claim 1, wherein a solder is formed within the second opening, a front end of the second terminal attached to the solder, the solder having a height equal to a height of the second opening so as to place the front end of the second terminal at approximately the same height as a front end of the first terminal.

3. The circuit assembly according to claim 2, wherein a bottom of the main body is provided with a third terminal, and the third terminal is connected to the conductive member through the first opening together with the main body.

4. The circuit assembly according to claim 2, wherein a connection portion is provided in a vicinity of a location on the one side of the substrate at which the first opening is formed, and at least a part of a region of the main body of the electronic component that is located on the one side of the substrate is connected to the connection portion.

5. The circuit assembly according claim 2, wherein the electronic component is disposed on the one side of the substrate such that the main body does not cover a part of the first opening.

6. The circuit assembly according to claim 1, wherein
a bottom of the main body is provided with a third terminal, and the third terminal is connected to the conductive member through the first opening together with the main body.

7. The circuit assembly according to claim 6, wherein a connection portion is provided in a vicinity of a location on the one side of the substrate at which the first opening is formed, and at least a part of a region of the main body of the electronic component that is located on the one side of the substrate is connected to the connection portion.

8. The circuit assembly according claim 6, wherein the electronic component is disposed on the one side of the substrate such that the main body does not cover a part of the first opening.

9. The circuit assembly according to claim 1, wherein
a connection portion is provided in a vicinity of a location on the one side of the substrate at which the first opening is formed, and
at least a part of a region of the main body of the electronic component that is located on the one side of the substrate is connected to the connection portion.

10. The circuit assembly according to claim 9, wherein
a through-hole is formed in the region of the substrate in which the connection portion is formed, and
the third terminal is connected to the connection portion, and is also connected to the conductive member through the through-hole.

11. The circuit assembly according claim 10, wherein the electronic component is disposed on the one side of the substrate such that the main body does not cover a part of the first opening.

12. The circuit assembly according to claim 1, wherein
the electronic component is disposed on the one side of the substrate such that the main body does not cover a part of the first opening.

13. The circuit assembly according claim 9, wherein the electronic component is disposed on the one side of the substrate such that the main body does not cover a part of the first opening.

* * * * *